(12) United States Patent
Lim

(10) Patent No.: US 8,138,545 B2
(45) Date of Patent: Mar. 20, 2012

(54) SEMICONDUCTOR DEVICE AND METHOD FOR MANUFACTURING THE SAME

(75) Inventor: Hyon-Chol Lim, Guro-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 61 days.

(21) Appl. No.: 12/636,017

(22) Filed: Dec. 11, 2009

(65) Prior Publication Data

US 2010/0148251 A1 Jun. 17, 2010

(30) Foreign Application Priority Data

Dec. 11, 2008 (KR) .................. 10-2008-0126178

(51) Int. Cl.
*H01L 29/78* (2006.01)

(52) U.S. Cl. .................. 257/335; 257/330; 257/343

(58) Field of Classification Search .......... 257/329–331, 257/335, 343, 378, 492, 493, E29.027, E29.261
See application file for complete search history.

(56) References Cited

U.S. PATENT DOCUMENTS

| 7,265,416 B2 * | 9/2007 | Choi et al. .................... 257/343 |
| 2004/0201061 A1 * | 10/2004 | Jeon et al. ...................... 257/335 |
| 2005/0001265 A1 * | 1/2005 | Shiraki et al. ................. 257/330 |

* cited by examiner

*Primary Examiner* — Marcos D. Pizarro
*Assistant Examiner* — Suian Tang
(74) *Attorney, Agent, or Firm* — Sherr & Vaughn, PLLC

(57) ABSTRACT

A semiconductor device includes: a substrate on and/or over which a first conductive type well is formed; and an LDMOS device that includes a gate electrode and has a drain region formed in the substrate. The LDMOS device includes a trench formed on the substrate, a second conductive type body that is formed on one side of the trench and on the substrate thereunder, and a first conductive type source region that is formed in the second conductive type body.

7 Claims, 5 Drawing Sheets

US 8,138,545 B2

SEMICONDUCTOR DEVICE AND METHOD FOR MANUFACTURING THE SAME

The present application claims priority under 35 U.S.C. 119 to Korean Patent Application No. 10-2008-0126178 (filed on Dec. 11, 2008), which is hereby incorporated by reference in its entirety.

BACKGROUND

Because related power metal oxide semiconductor field effect transistors (MOSFET) have an input impedance higher than a bipolar transistor, it has a large power gain and a simple gate driving circuit. Also because a power MOSFET is a unipolar device, it has no time delay due to the accumulation or recombination of minority carriers while it is turned-off.

Therefore, the application of the power MOSFET in such circuits as a switching mode power supply apparatus, a lamp stabilization and motor driving circuit, etc, has gradually expanded. As for the structure of a related power MOSFET, a double diffused MOSFET structure using a planar diffusion technology has been used. One related representative device using the DMOSFET structure is an LDMOS device.

A photo resist is used as a blocking mask at the time of forming a P type body of the LDMOS device. The photo resist has an effect on a channel region at the time of an ion implantation process into a buried layer that is processed with high energy, such that it is difficult to uniformly control Vt of the device.

SUMMARY

Embodiments relate to a semiconductor device having beneficial electric characteristics by forming a channel in a vertical and lateral type and a method for manufacturing the same.

A semiconductor device according to embodiments includes: a substrate on and/or over which a first conductive type well is formed; and an LDMOS device that includes a gate electrode and has a drain region formed in the substrate, wherein the LDMOS device includes a trench formed on and/or over the substrate, a second conductive type body that is formed on and/or over one side of the trench and on and/or over the substrate therebeneath, and a first conductive type source region that is formed in the second conductive type body.

In addition, a semiconductor device according to embodiments includes: a substrate on and/or over which a device isolation layer, a first conductive type well, and a drain region are formed; a trench formed by etching a portion of the substrate; a second conductive type body that is formed in the substrate in a shape enclosing the trench; a first conductive type source region and a second conductive type contact region that are formed in the second conductive type body; and a first gate electrode that is formed on and/or over the substrate and of which a portion is formed in the trench.

In addition, a method according to embodiments includes: implanting impurity in a substrate on and/or over which a first conductive type deep well is formed; forming a trench by etching a portion of the substrate; forming a second conductive type body on and/or over one side of the trench and a lower substrate; forming a polysilicon on and/or over an upper side of the substrate and in the trench; forming first and second gate electrodes by patterning the polysilicon; and forming a first conductive type source region and drain region in the substrate.

DRAWINGS

DESCRIPTION

Prior to the detailed description of embodiments, a MOS transistor will be described. In the MOS transistor, a Vt value is determined by a concentration of a substrate, capacitance of a gate oxide and a polysilicon gate, a length of a channel, etc. Among those, a value changed by a process is a body factor, which may be a concentration of a substrate and capacitance of the gate oxide and the polysilicon gate.

In the case of an LDMOS device, the Vt value is determined by a difference in thermal diffusivity between boron and arsenic due to double diffusion. In the impurity implantation process, when the photoresist is used as an ion implantation mask, boron ions are implanted with high energy such that the length of the channel may be irregular according to the profile of the photoresist. In addition, in this aspect, the Vt value can be changed by a mask misalign between the P type body and the gate.

As a result, in order to make minimize the change of the Vt value, a method for increasing an absolute amount of a capacitance size can be considered and a method for increasing a length of a channel can be also considered. However, a length of the channel is increased laterally such that the size of the device is larger than related devices, which is contrary to the high integration tendency of the device.

Therefore, embodiments include a structure and a method that spatially increase the length of the channel by forming the channel laterally and vertically in order to increase the length of the channel, thereby making it possible to minimize the fluctuation in the Vt of the semiconductor device.

Figure 1:
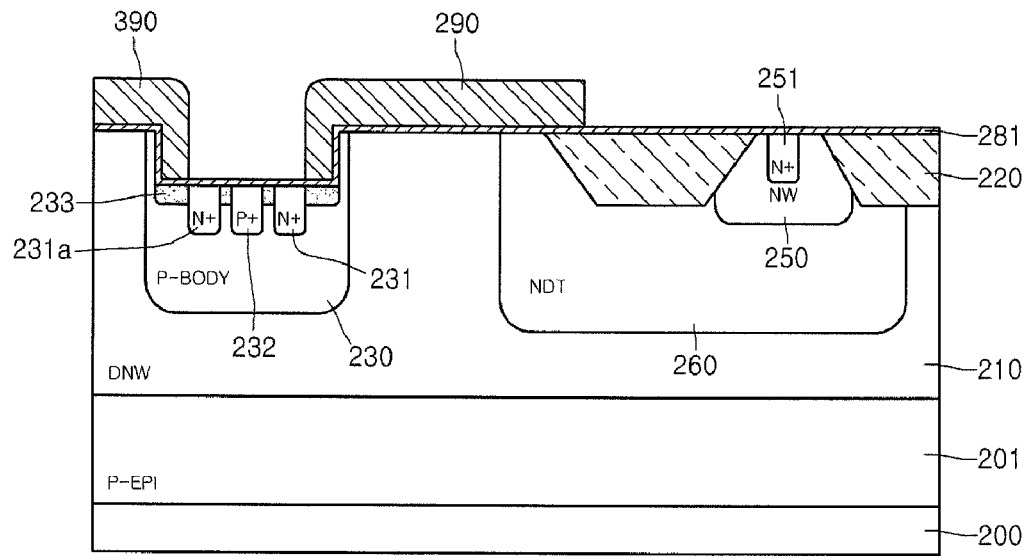
FIG. 1 is a diagram showing a configuration of a semiconductor device according to embodiments.
Figure 2:
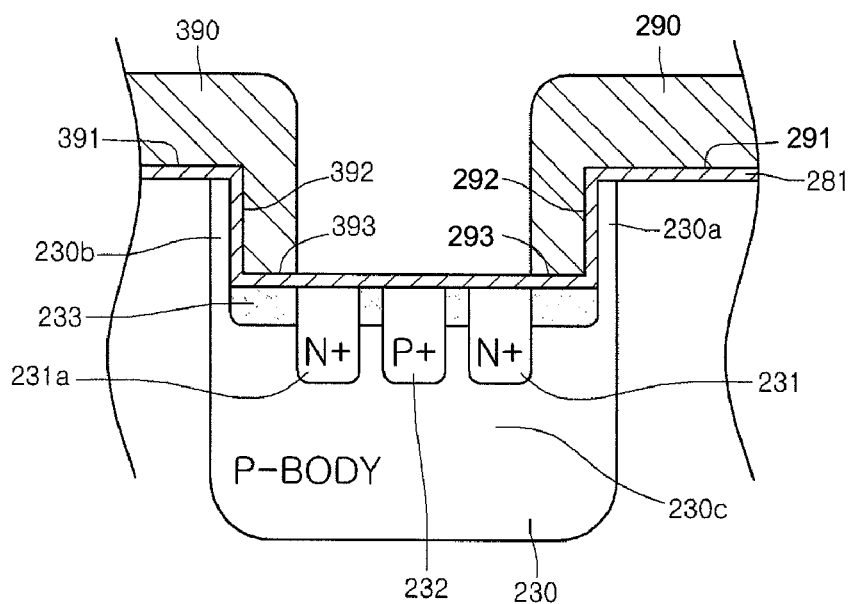
FIG. 2 is an enlarged view of a P type body region and a gate configuration according to embodiments.

FIG. 1 is a diagram showing a configuration of a semiconductor device according to embodiments, and FIG. 2 is an enlarged view of a P type body region and a gate configuration according to embodiments. A first conductive type high-concentration N-type buried layer is deeply formed in P type substrate that is a second conductive type of an LDMOS and a P type epitaxial layer 201 is formed on and/or over the buried layer.

The N type buried layer reduces a width of a depletion region expanded from a P type body 230 when voltage is applied to a N+ type drain region 251, thereby maximizing a punch through voltage. The P type epitaxial layer 201 precipitates a semiconductor crystal in a gas state on a wafer that performs a role of the substrate, such that the crystal is formed or grown along a crystal axis of the P type substrate and the resistivity of the P type substrate is minimized.

In addition, an N type deep well 210 may be formed on and/or over the substrate 200 and a channel region may be formed at a contact surface of the P type body 230 and the N type deep well 210 and near a surface of the P type body 230 that exists between N+ type source regions 231 and 231a according to a bias voltage applied to gate electrodes 290 and 390.

Meanwhile, a gate oxide layer 281 and the gate electrodes 290 and 390 are formed on and/or over a predetermined region of the substrate 200 and the second gate electrode 390 adjacent to the first gate electrode 290 and the first gate electrode 290 is connected to the N+ type source regions 231 and 231a, respectively, which are formed in the same P type body 230 region.

In particular, in order to form the channel at the P type body 230 in a lateral direction and a vertical direction with respect to FIG. 1, a portion of the upper side of the substrate 200 may be etched to have a trench and first and second gate electrodes 290 and 390 may be formed in a bent shape along the surface of the substrate on which the trench is formed. In other words, the P type body 230 may be formed in the lateral direction and the vertical direction along the bent substrate by the structure more fully described below.

The following description will be described based on the first gate electrode 290 that is largely shown at the central portion of FIG. 1. The P type body 230 may be formed on and/or over the substrate 200 of one side of the first gate electrode 290 and two N+ type source regions 231 and 231a and a P+ type contact region 232 may be formed in the P type body 230. Subsequently, the P type body 230 may be formed with a relatively high concentration in order to maximize the punch through phenomenon of the LDMOS device. An LDD and an N type impurity layer 233 performing a role of the double diffusion may be formed at a region adjacent to the N+ type source regions 231 and 231a and the P+ type contact region 232. In addition, an N type drift region 260 (NDT), an N type well 250, and the device isolation layer 220 may be formed on and/or over the substrate 200 of the other side of the first gate electrode 290 and the N+ type drain region 251 is formed in the N type well 250.

As a configuration to maximize the length of the channel of the LDMOS device in a lateral direction according to embodiments, a configuration of the P type body region, the substrate having the trench, and the gate electrode, etc., will be described with reference to FIG. 2. The trench may be formed by etching a portion of the substrate 200 on which the P type body 230 being the second conductive type is formed. The first N+ type source region 231, as the source region for the first gate electrode 290, and the second N+ type source region 231a, as the source region for the second gate electrode 390, may be formed on and/or over the substrate of the lower side of the trench. The P+ type contact region 232 may be formed between the first N+ type source region 231 and the second N+ type source region 231a.

The N type impurity layer 233 for forming the LDD and the double diffusion in addition to the first and second N+ type source regions 231 and 231a and the P+ type contact 232 can be formed on the lower side of the trench formed on the substrate. In particular, the P type body 230 may be formed along the trench formed in the substrate and thus, the P type body 230 may have a U-letter shape by forming a portion thereof to be vertically extending. That is, the P type body 230 includes the first P type body region 230a and the second body region 230b that are formed along a side wall of the trench in the substrate and a third P type body region 230c that is formed in the substrate of the lower side of the trench. In other words, the P type body 230 may be formed on the lower side of the substrate and a groove in a trench shape is formed on and/or over the substrate corresponding to a region, in which the P type body 230 is formed, by etching a portion of the substrate. The first and second P type body regions 230a and 230b, which configures the P type body 230, are formed in a vertical direction along the side wall of the trench, thereby increasing the length of the channel.

The N+ type source regions 231 and 231a and the gate electrodes 290 and 390 in the P type body 230 having this shape may be formed to be adjacent to each other and may also be formed in a bent shape due to the trench formed on and/or over the substrate. In particular, the adjacent gate electrodes is formed to be bent to the common P type body side since the plurality of source regions 231 and 231a are formed in the P type body 230. The gate electrodes 290 and 390 having a bent structure according to embodiments have first surfaces 291 and 391 that are formed on and/or over the upper surface of the substrate 200, second surfaces 292 and 392 that are formed along the side wall of the trench in the substrate, and third surfaces 293 and 393 of which portions are formed at the bottom of the trench in the substrate.

Figure 3:
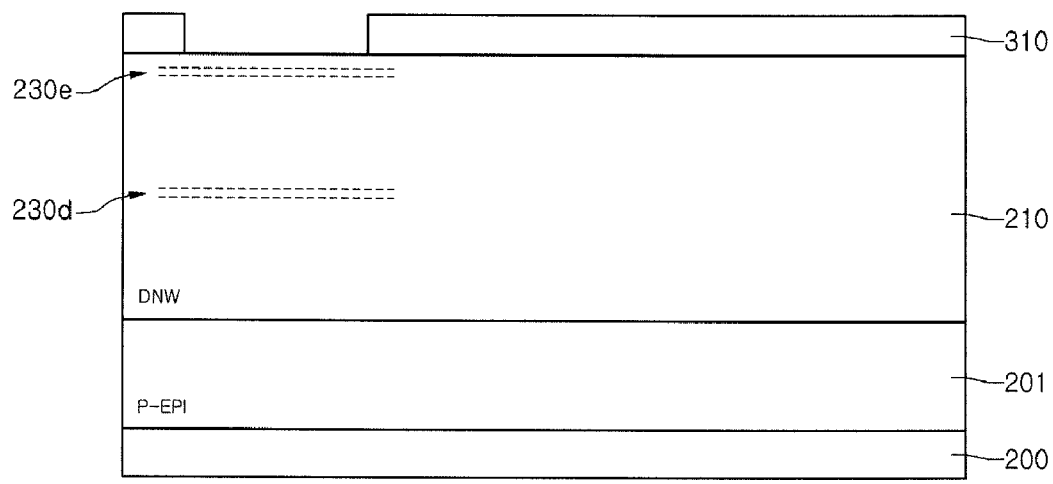
FIGS. 3 to 9 are diagrams for explaining a method for manufacturing a semiconductor device according to embodiments.

One example method for manufacturing the semiconductor device having the above-mentioned configuration will be described with reference to FIGS. 3 to 9. FIGS. 3 to 9 are diagrams for explaining one example method for manufacturing a semiconductor device according to embodiments. Referring first to FIG. 3, the second conductive type epitaxial layer 201 is formed on and/or over the second conductive type substrate 200 and the N type deep well 210 is formed in the substrate by the impurity implantation. A photoresist 310 that opens the surface of the substrate on which the P type body region will be formed is formed on and/or over the substrate 200 on which the N type deep well 210 is formed and the P type impurity (for example, boron ion (B+)), which is the second conductive type, is implanted using the photoresist 310 as the ion implantation mask.

In other words, a first P type impurity layer 230d, which determines the size of the P type body to be formed, may be formed in the substrate by implanting the P type impurity with relatively high implantation energy and a second P type impurity layer 230e is formed by again implanting the P type impurity using relatively low implantation energy so that the channel may be formed in a vertical direction in the P type body. However, although the steps just described involve forming the first P type impurity layer 230d and then forming the second P type impurity layer 230e, the order can be changed according to embodiments.

Meanwhile, the ion implantation process for forming the second P type impurity layer 230e may be performed in the state where the implantation angle for the P type impurity is tilted (a state in which the implantation angle is tilted at a predetermined angle). Since the surface of the substrate exposed by the photoresist 310 is etched by the subsequent process, the P type impurity may be implanted into the substrate of the lower side of the photoresist 310. In other words, when the etching process is performed on the exposed substrate surface, a portion of the second P type impurity layer 230e is also removed such that it becomes the foregoing first P type body region 230a and second P type body region 230b positioned at both sides of the trench formed on the substrate.

Therefore, the ion implantation process for forming the second P type body region 230e may also form the P type impurity in the vertical lower region of the photoresist 310 that is formed as the ion implantation mask. For reference, the region doped with the second P type impurity layer 230e does not easily match the first and second P type body regions 230a and 230b as shown in FIGS. 1 and 2, but since the diffusion is performed by the subsequent heat treatment process, only a portion of doping is shown in the drawings.

Figure 4:
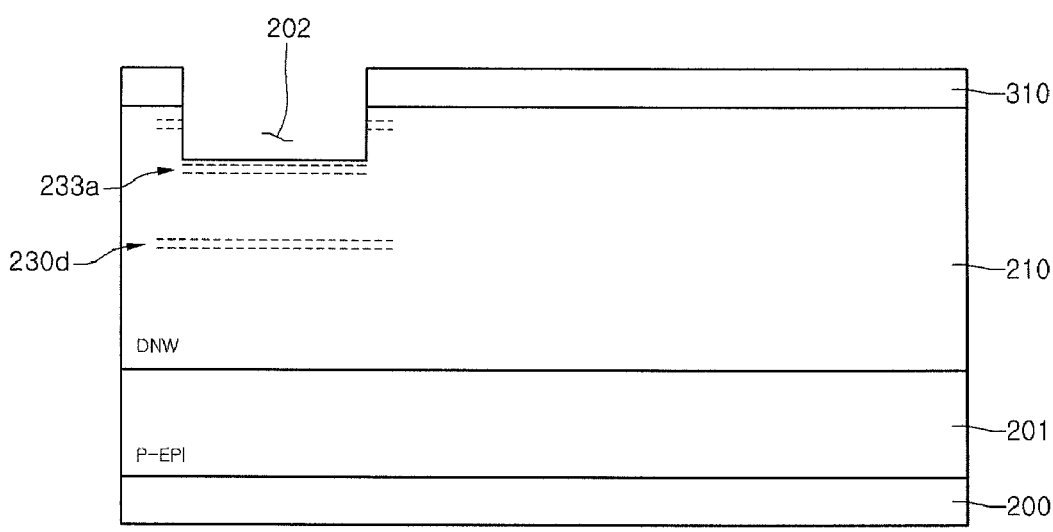

Referring to FIG. 4, a process of removing a portion of the exposed substrate 200 is performed by using the photoresist 310 as an etch mask. Thereby, the trench 202 may be formed on the substrate 200 at a predetermined depth. In particular, the second P type impurity 230e implanted with the P type impurity may also be removed by etching a portion of the substrate 200, but the P type impurities configuring the P type body remain in the substrate at both sides of the trench 202.

With the trench 202 formed in the substrate, the N type impurity (for example, arsenic (As)) for forming the LDD and the double diffusion may be implanted into the lower side of the trench using the photoresist 310 as the ion implantation mask. In other words, the N type doping region 233a for forming the N type impurity layer may be formed at the lower side of the surface of the substrate exposed by forming the trench 202. The N type doping region 233a becomes the foregoing N type impurity layer 233 by a subsequent heat treatment process.

Figure 5:
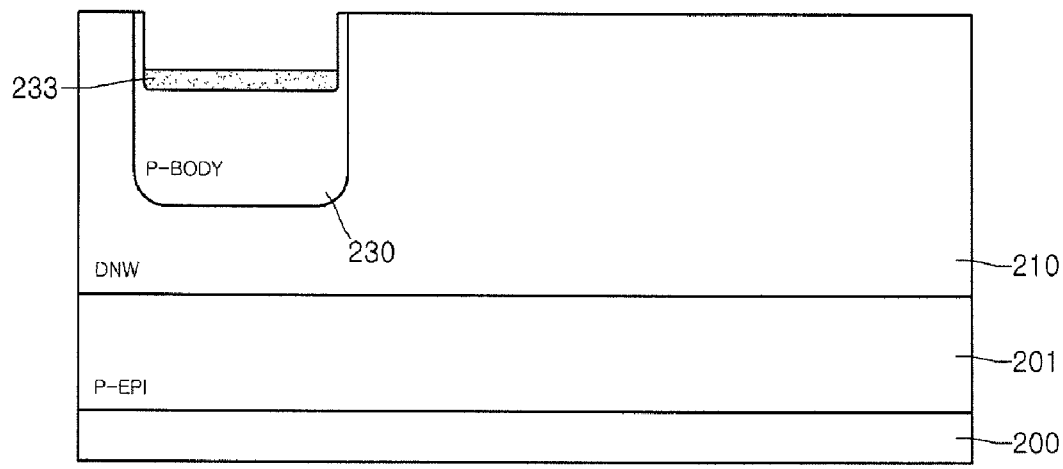

Referring to FIG. 5, the P type body 230, which has the first and second P type body regions 230a and 230b (see FIG. 2) formed along the side wall of the trench of the substrate and the third P type body region 230c (see FIG. 2) formed on the substrate of the lower side of the trench, may be formed by removing the photoresist 310 and performing a drive-in or heat treatment process on the substrate 200. The N type doping region, which is formed in the substrate of the lower side o the trench, may become the N type impurity layer 233 for forming the LDD and the double diffusion by a heat treatment process.

Figure 6:
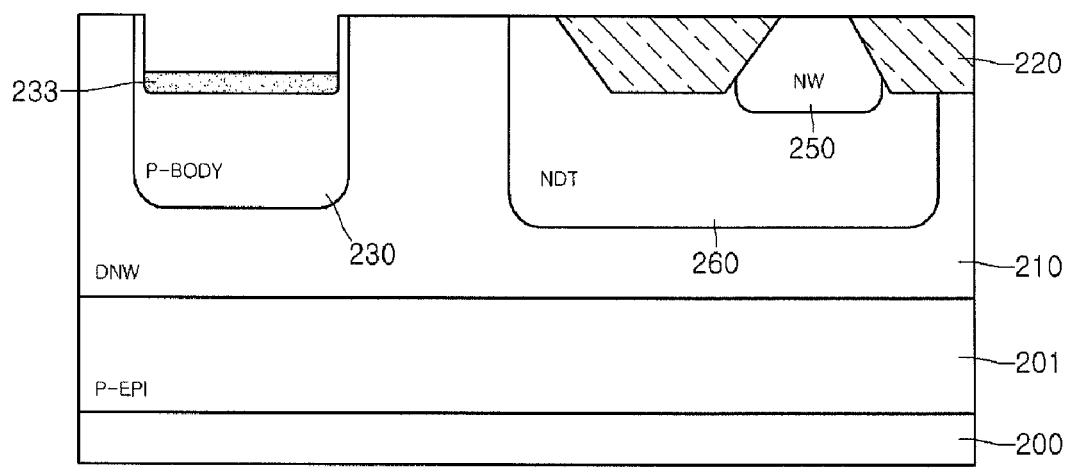
Figure 7:
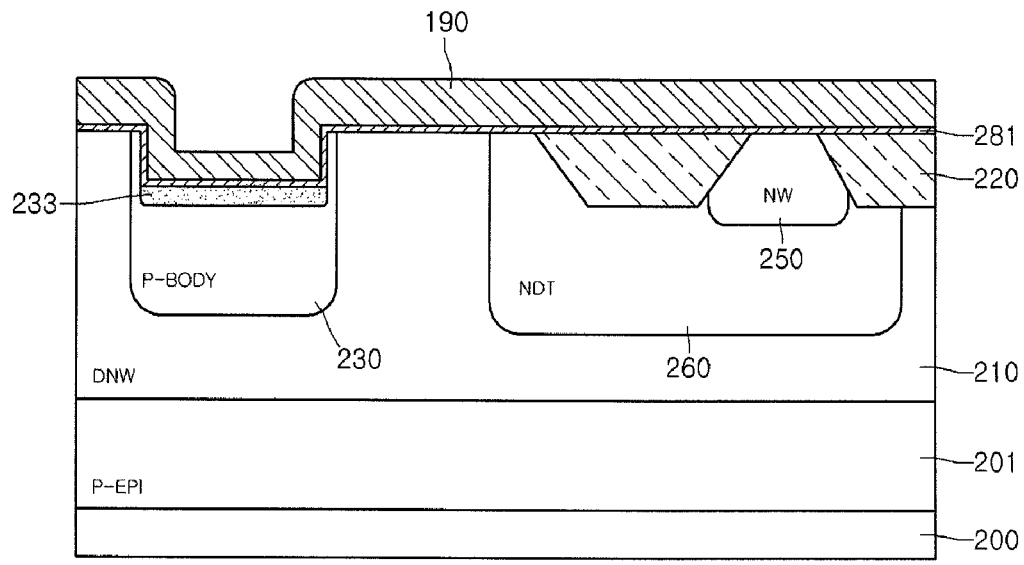

Referring to FIG. 6, the N type drift region 260, the N type well 250, and the device isolation layer 220 may be formed in the substrate 200 by related methods. Thereafter, referring to FIG. 7, a gate oxide layer 281 may be formed in the trench and on and/or over the substrate 200 on which the trench is formed. A polysilicon 190 may be formed on and/or over the gate oxide layer 281. The gate oxide layer 281 and the polysilicon 190 is formed in a bent shape due to the trench formed on and/or over the substrate.

Figure 8:
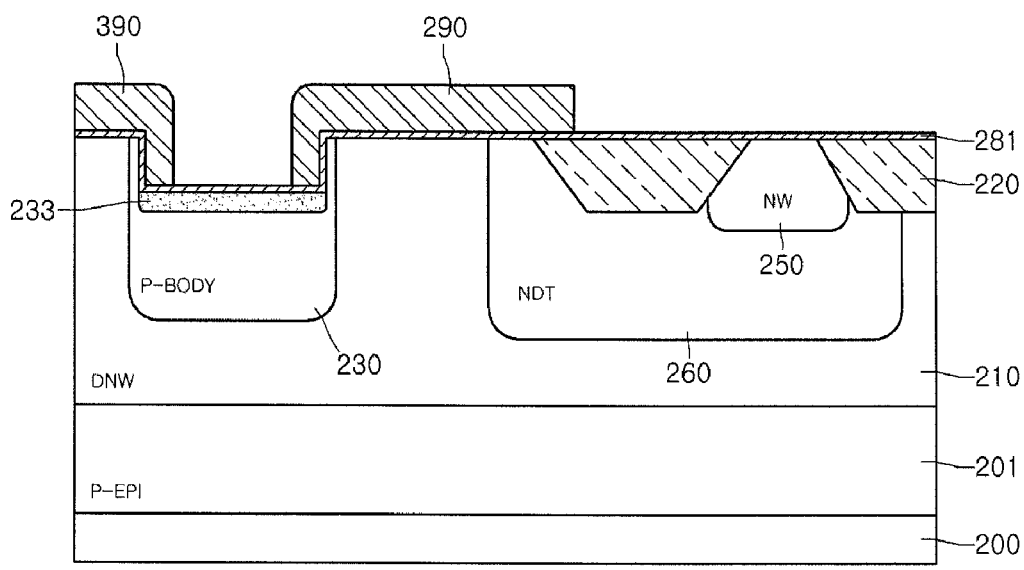

Thereafter, referring to FIG. 8, a portion is formed in the trench and the remaining portions form the gate electrodes 290 and 390 formed on and/or over the substrate by patterning the polysilicon 190. It is already described that the gate electrodes 290 and 390 has the first surfaces 291 and 391 (see FIG. 2) that are formed on the upper surface of the substrate, the second surfaces 292 and 392 (see FIG. 2) that are formed along the side wall of the trench, and the third surfaces 293 and 393 (see FIG. 2) that are formed on the lower side portion of the trench.

Figure 9:
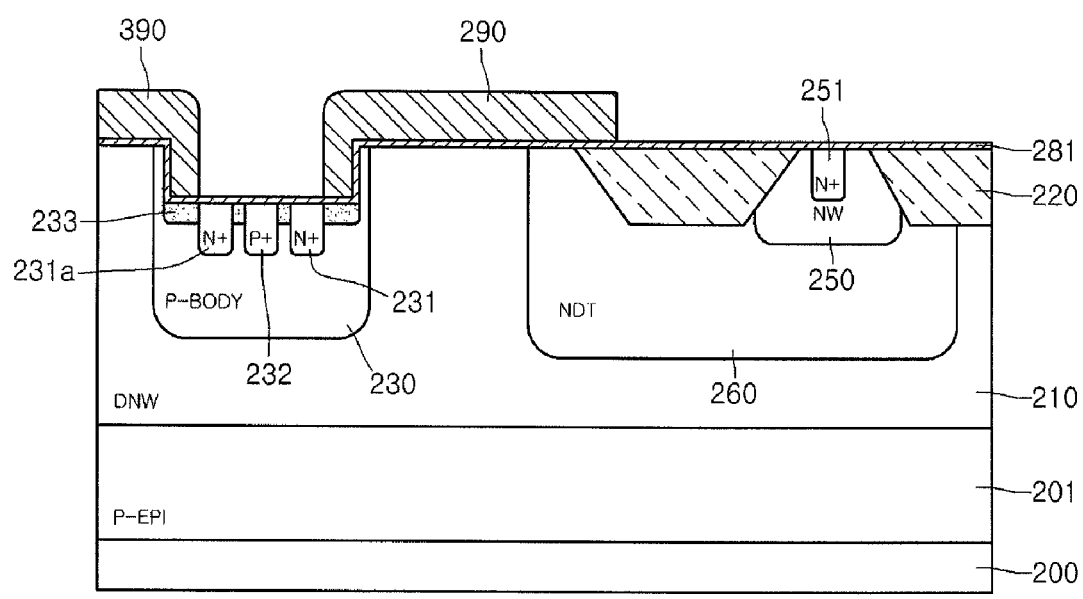

As shown in FIG. 9, the first and second N+ type source regions 231 and 231a and the P+ type contact region 232 may be formed and the N+ type drain region 251 may be formed, by performing the process of implanting impurity into the substrate. Thereby, the gate electrodes having a structure toward the common P type body region may be formed. In subsequent processes, various related technologies may be used according to the embodiments.

According to the semiconductor device and the method for manufacturing the same as described above, a P type body may be formed along the side wall of the trench formed on and/or over the substrate, thereby making it possible to maximize the length of the channel. In particular, the electric characteristics can be improved by forming the channel in the vertical and lateral type, as compared to related LDMOS devices configured by forming the channel in only the lateral type.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus, comprising:
   a substrate over which a first conductive type well is formed; and
   an LDMOS device that includes a gate electrode, a drain region formed in the substrate, a trench formed over the substrate, a second conductive type body surrounding both sides and a bottom surface of the trench, a first source region, a second region and a second conductive type contact region formed between the first source region and the second source region on the bottom surface of the trench in the second conductive type body,
   wherein the gate electrode is formed in a bent shape along a first surface formed over the substrate, a second surface formed along a side wall of the trench, and a third surface formed at a portion of the bottom surface of the trench.

2. The apparatus of claim 1, wherein the second conductive type body includes first and second body regions formed over the substrate on one side and another side of the trench and a third body region formed over the substrate proximate a lower side of the trench.

3. The apparatus of claim 1, further comprising a first conductive type impurity layer formed at a region adjacent to the first source region and the second source region and a second conductive type contact region on the bottom surface of the trench.

4. The apparatus of claim 1, wherein at least a portion of the gate electrode is formed in the trench.

5. The apparatus of claim 4, wherein the gate electrode includes first and second gate electrodes, and
   the first gate electrode and the second gate electrode have a predetermined interval based on the second conductive type contact region.

6. The apparatus of claim 1, wherein the substrate of the lower side of the trench is formed with a first conductive type impurity layer.

7. The apparatus of claim 1, wherein the first conductive type is a N type.

* * * * *